(12) United States Patent
Nakagawa et al.

(10) Patent No.: US 8,278,133 B2
(45) Date of Patent: Oct. 2, 2012

(54) METHOD FOR JOINING A FILM ONTO A SUBSTRATE

(75) Inventors: Tohru Nakagawa, Shiga (JP); Akihiro Itoh, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/277,004

(22) Filed: Oct. 19, 2011

(65) Prior Publication Data

US 2012/0040491 A1 Feb. 16, 2012

Related U.S. Application Data

(63) Continuation of application No. PCT/JP2011/002252, filed on Apr. 18, 2011.

(30) Foreign Application Priority Data

Apr. 20, 2010 (JP) ................................. 2010-096785

(51) Int. Cl.
*H01L 21/00* (2006.01)
(52) U.S. Cl. .................................... 438/93; 257/E31.02
(58) Field of Classification Search ..................... 438/93; 257/E31.02
See application file for complete search history.

(56) References Cited

U.S. PATENT DOCUMENTS

| 4,774,194 | A | 9/1988 | Hokuyou |
| 6,316,332 | B1 | 11/2001 | Lo et al. |
| 7,608,520 | B2 | 10/2009 | Sugita et al. |

| 2002/0036146 | A1* | 3/2002 | Akutsu et al. ................. 205/316 |
| 2002/0048900 | A1 | 4/2002 | Lo et al. |
| 2009/0038678 | A1 | 2/2009 | Pan et al. |

FOREIGN PATENT DOCUMENTS

| JP | 5-022557 | 3/1993 |
| JP | 06-151946 | 5/1994 |
| JP | 2000-277779 | 10/2000 |

(Continued)

OTHER PUBLICATIONS

Makoto Konagai et al., "High Efficiency GaAs Thin Film Solar Cells by Peeled Film Technology," Journal of Crystal Growth, vol. 45, pp. 277-280, 1978.

(Continued)

*Primary Examiner* — Tony Tran
(74) *Attorney, Agent, or Firm* — McDermott Will & Emery LLP

(57) ABSTRACT

A method for joining a film onto a substrate comprises: a step (A) of floating the film on an interface between an aqueous liquid and a water-insoluble liquid; a step (B) of immersing the substrate into the aqueous liquid; a step (C) of stacking the substrate onto said one surface of the film in the aqueous liquid; a step (D) of immersing the stacked substrate and film into the water-insoluble liquid with maintaining the substrate being stacked on the film to adhere the film to the substrate; and a step (E) of drawing up the stacked substrate and film from the water-insoluble liquid with maintaining the substrate being stacked on the film to join the film onto the substrate.

6 Claims, 11 Drawing Sheets

FOREIGN PATENT DOCUMENTS

| | | |
|---|---|---|
| JP | 2002-531944 | 9/2002 |
| JP | 2003-068995 A | 3/2003 |
| JP | 2006-032784 A | 2/2006 |
| JP | 2006-286823 | 10/2006 |
| JP | 2009-277944 | 11/2009 |
| WO | WO 97/41590 A1 | 11/1997 |
| WO | WO 00/33363 | 6/2000 |
| WO | WO 2005/045908 A1 | 5/2005 |

OTHER PUBLICATIONS

J.J. Schermer et al., "High rate epitaxial lift-off of InGaP films from GaAs substrates," Applied Physics Letters, vol. 76, No. 15, pp. 2131-2133, 2000.

J.J. Schermer et al., "Epitaxial Lift-Off for large area thin film III/V devices," Physica Status Solidi A., vol. 202, No. 4, pp. 501-508, 2005.

* cited by examiner

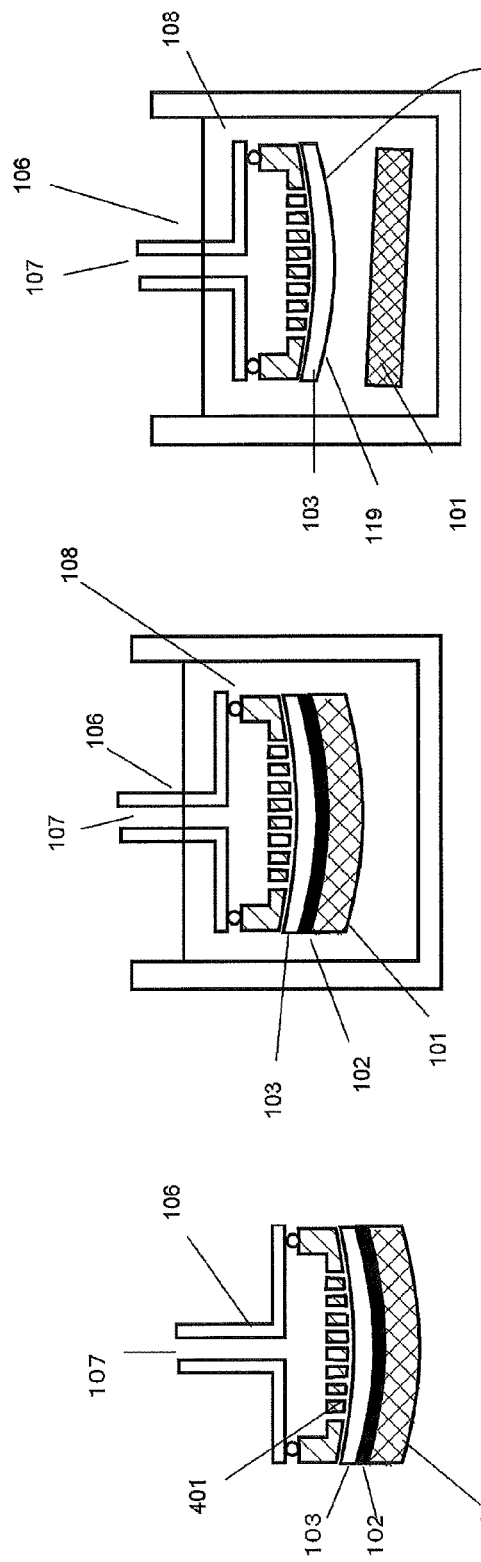
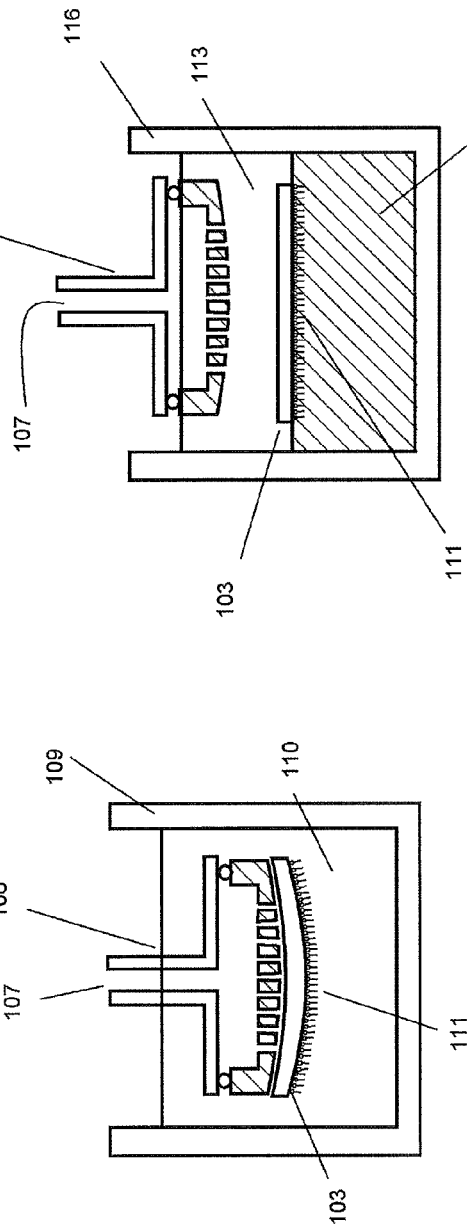

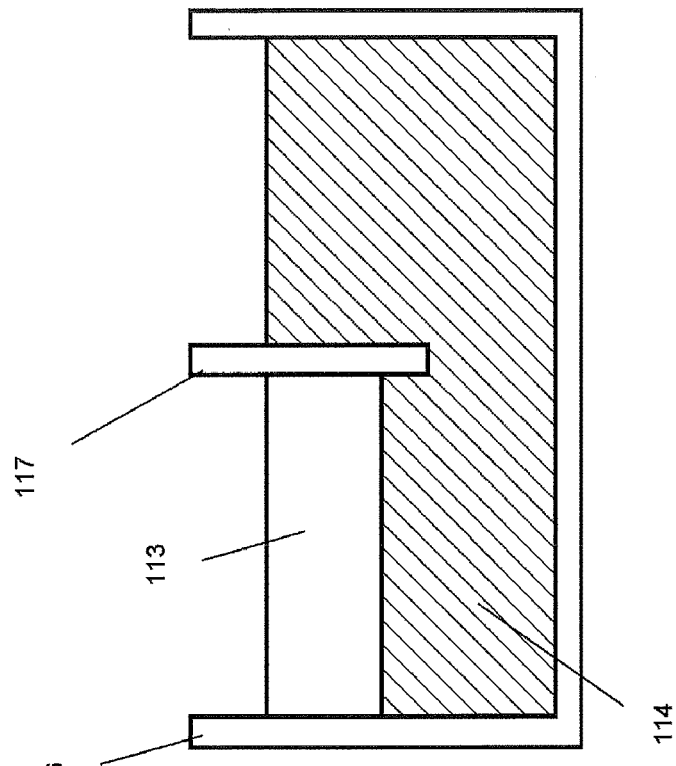
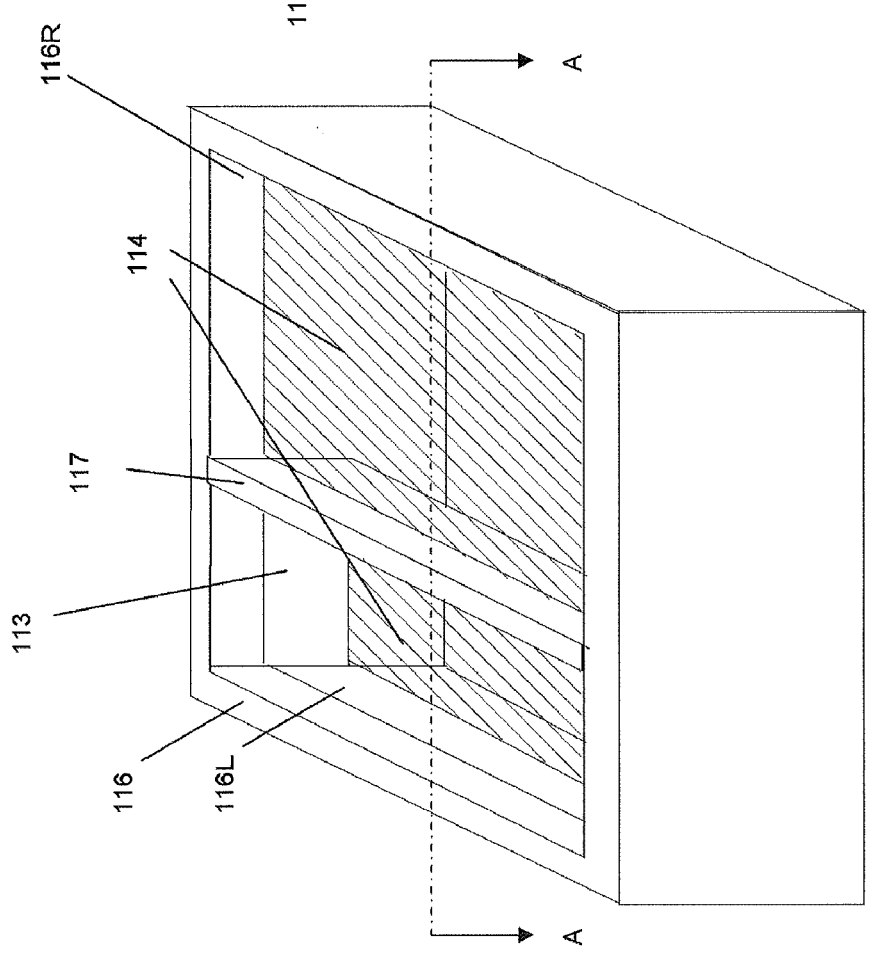
FIG.2(b)
FIG.2(a)

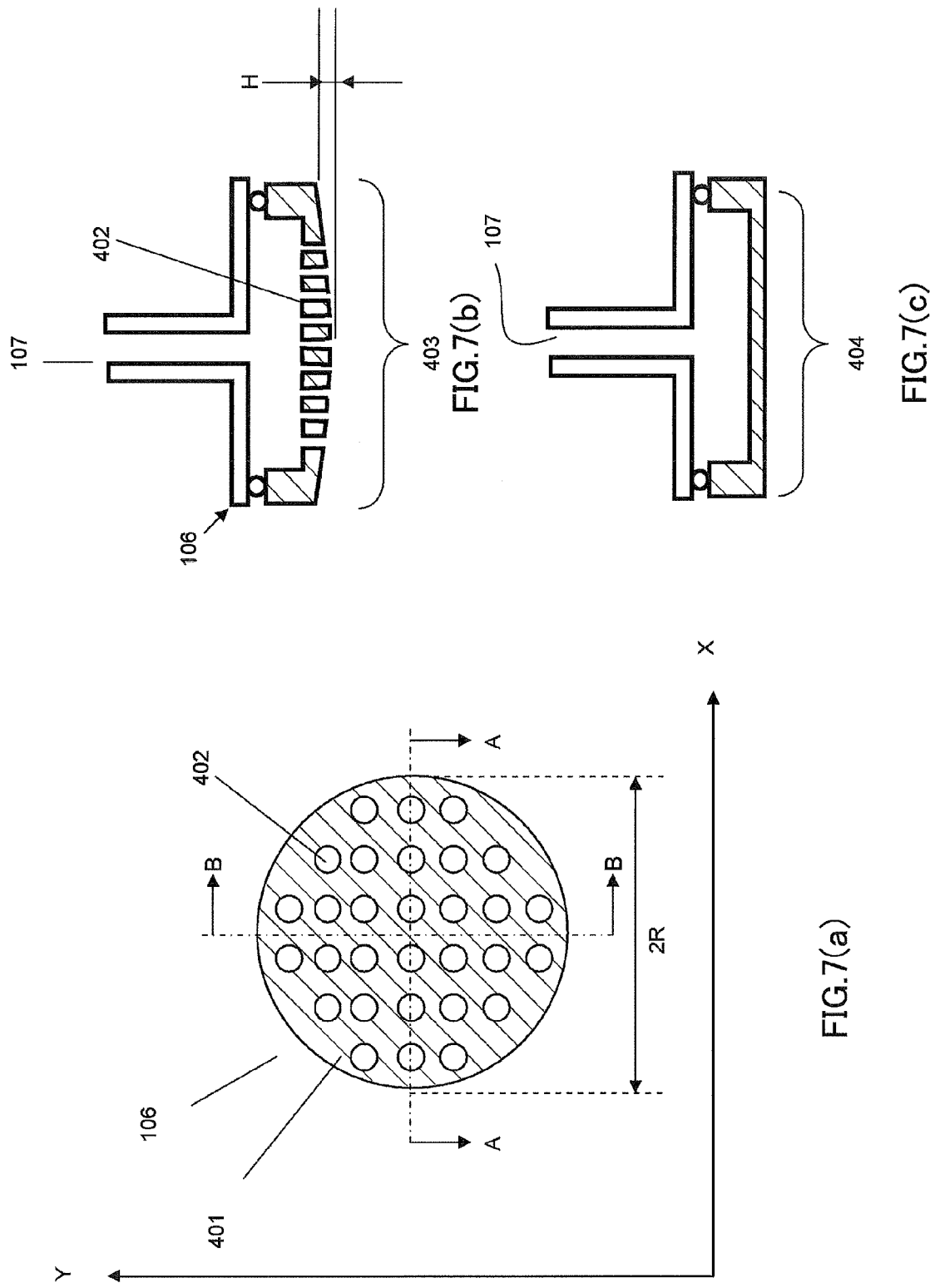

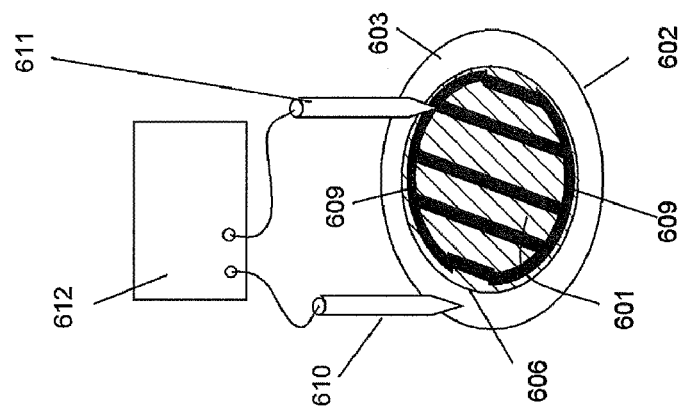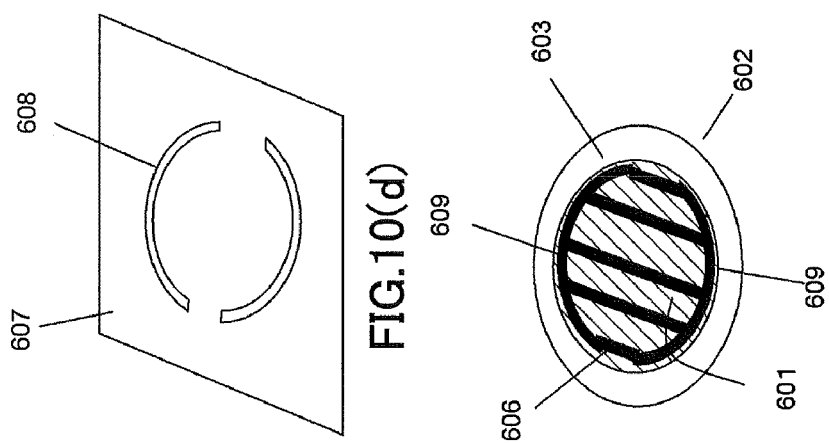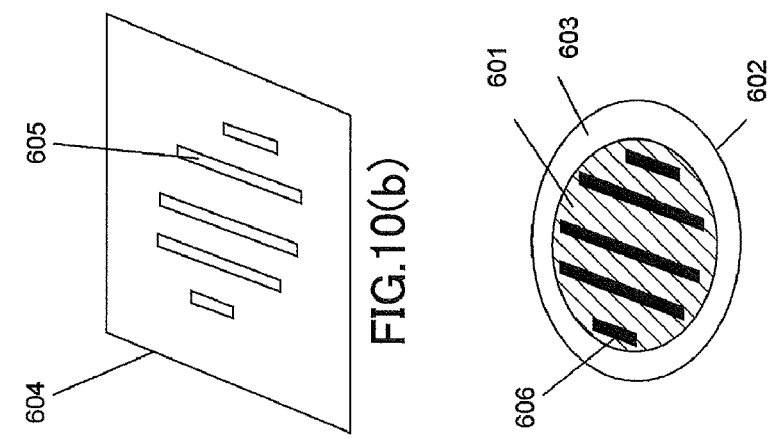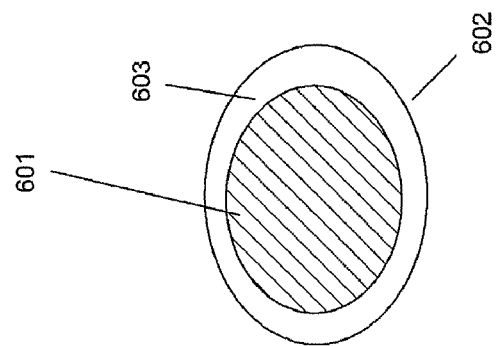

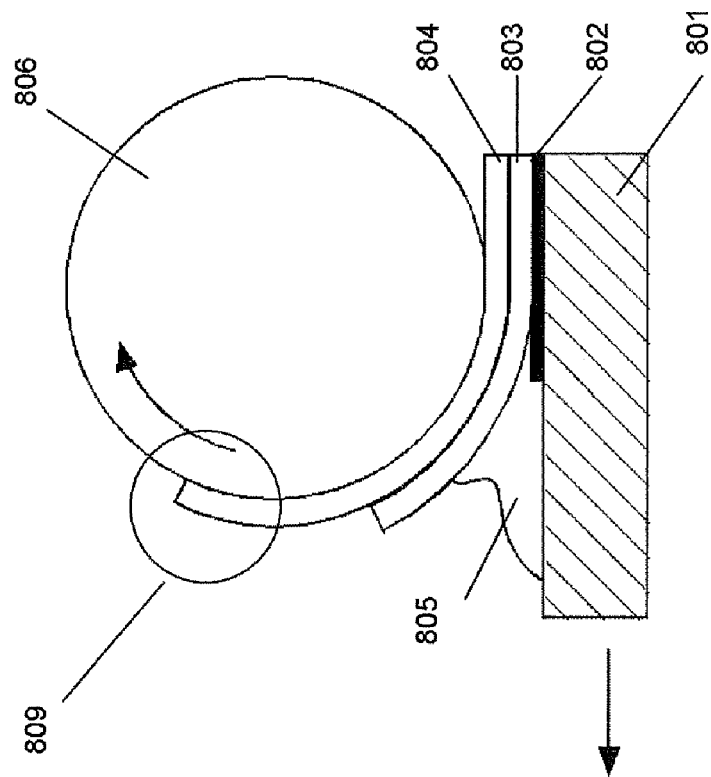
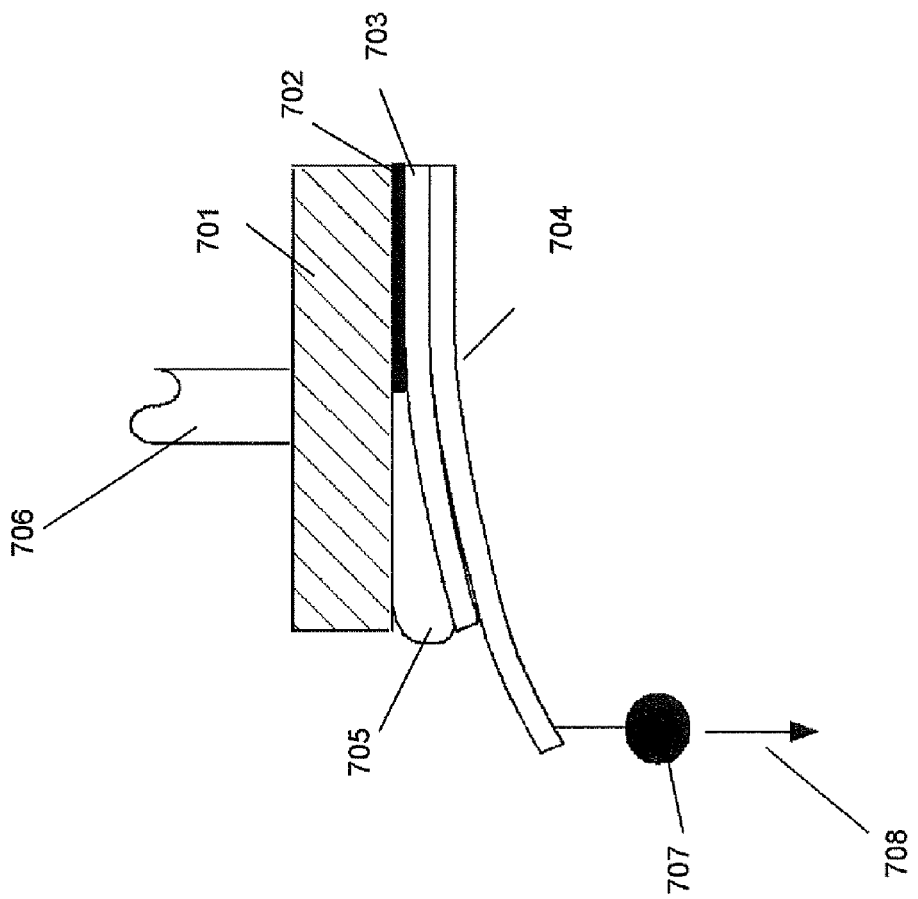
FIG.11(b)
FIG.11(a)

METHOD FOR JOINING A FILM ONTO A SUBSTRATE

RELATED APPLICATIONS

This application is a continuation of PCT International Application No. PCT/JP2011/002252, filed on Apr. 18, 2011, which in turn claims the benefit of Japanese Application No. 2010-096785, filed on Apr. 20, 2010, the disclosures of which Applications are incorporated by reference herein.

BACKGROUND OF THE INVENTION

1. Field of the Invention

The present disclosure relates to a method for joining a film onto a substrate. Particularly, the present disclosure relates to a method for joining a solar cell film onto a substrate.

2. Description of Related Art

Patent Literature 1 (U.S. Pat. No. 4,774,194), Patent Literature 2 (United States Pre-Grant patent publication No. 2009/0038678), and Non Patent Literature 1 (M. Konagai et at, Journal Crystal Growth 45(1978)277-280) disclose an epitaxial lift-off method for fabricating a solar cell. The epitaxial lift-off method includes a step of peeling a III-V semiconductor solar cell film with a thickness of several micrometers formed on a GaAs sacrifice substrate from the GaAs sacrifice substrate and a step of joining the III-V semiconductor solar cell film onto another substrate.

More particularly, in the epitaxial lift-off method, a sacrifice layer such as an AlAs layer, a $Ga_{0.3}Al_{0.7}As$ layer, or an $AlAs_{0.98}P_{0.02}$ layer is formed on the GaAs sacrifice substrate. The III-V semiconductor solar cell film made of, for example, a GaAs film, a GaInP film or an InGaAs film is formed on the sacrifice layer. Subsequently, by using an adhesive resin such as wax, the GaAs solar cell is joined on a for-joining-substrate.

Next, the joined substrates are immersed in hydrofluoric acid or hydrochloric acid. The etching rate of the sacrifice layer by the hydrofluoric acid or the hydrochloric acid is much greater than the etching rate of the solar cell film. Accordingly, only the sacrifice layer is etched and the solar cell film is peeled from the GaAs sacrifice substrate. Optionally, the peeled solar cell film is joined onto another substrate.

The GaAs sacrifice substrate can be reused in the epitaxial lift-off method. Accordingly, an amount of the GaAs sacrifice substrate to be consumed is reduced, and the solar cell may be fabricated at low cost. The solar cell film fabricated by the epitaxial lift-off method may be joined onto a plastic substrate, thereby obtaining a lightweight solar cell. Since lightness is required for components loaded on an artificial satellite, the solar cell joined onto the plastic substrate may be preferable for the artificial satellite.

The epitaxial lift-off method requires a technique for peeling a solar cell film having a large area for a short time, since it is more efficient that a solar cell film having a large area is joined onto the sacrifice substrate at one time than the case where solar cell films each having a small area are joined onto the substrate many times. The shorter the period during the sacrifice layer is etched becomes, the shorter the period required for fabricating the solar cell becomes.

Non Patent Literature 2 (J. J. Schermer et al., Applied Physics Letters 76(2000)2131-2133) and Non Patent Literature 3 (J. J. Schermer et al., Physica Status Solidi 202(2005) 501-508) disclose a method for peeling a GaAs solar cell film having a large area from a GaAs substrate in a short time.

FIG. 11(a) shows the method disclosed in Non Patent Literature 2. A sacrifice substrate 701 including a sacrifice layer 702 and a solar cell film 703 is adhered to a sheet for joining 704 (hereinafter referred to as "for-joining-sheet") by using an adhesive such as wax. A weight 707 is attached to the edge of the for-joining-sheet 704, and the sacrifice layer 702 is subjected to a hydrofluoric acid solution 705 to etch the sacrifice layer 702. The gravity 708 of the weight 707 draws downwardly the for-joining-sheet 704. The solar cell film 703 which is being peeled from the substrate 701 is bent downwardly, and thus the sacrifice layer 702 is more subjected to the hydrofluoric acid solution 705. As a result, the solar cell film 703 is peeled from the substrate 701.

The period required for peeling the solar cell film 703 from the sacrifice substrate 701 is shorter than the period required in a case where the weight 707 is not used. Accordingly, the solar cell film 703 with a large area can be peeled from the substrate 701 in a short time.

FIG. 11(b) shows the method disclosed in Non Patent Literature 3. Instead of withdrawing the for-joining-sheet 704 by the weight 707, in FIG. 11(b), a for-joining-sheet 804 is rolled by a cylinder 806.

In particular, the substrate 801 including a sacrifice layer 802 and a solar cell film 803 is adhered to a for-joining-sheet 804 by using an adhesive such as wax. Next, the edge 809 of the for-joining-sheet 804 is fixed to the cylinder 806. The sacrifice layer 802 is subjected to a hydrofluoric acid solution 805, and the sacrifice layer 802 is etched to peel the solar cell film 803 from the substrate 801. While the cylinder 806 is rotated clockwise, the substrate 801 is move to the left to peel the solar cell film 803 from the substrate 801.

SUMMARY OF THE INVENTION

The epitaxial lift-off method requires that the solar cell film is fixed to the for-joining sheet by using an adhesive such as wax. In a case where the wax is unnecessary after fixed, is necessary to remove the wax.

The solar cell film to be peeled in the epitaxial lift-off method has a thickness of only several micrometers. When the wax is removed, the surface of the solar cell film may be damaged chemically and mechanically.

The method for peeling the solar cell film from the substrate with the weight or the cylinder requires an accurate combination and setting of the position and the heft of the weight, or of the rotation speed of the cylinder. An improper setting would cause the solar cell film to be cut and broken.

One of the purposes of the present disclosure is to provide a method for joining a film onto a for-joining-substrate without using an adhesive such as wax and without any mechanical or chemical damage.

The present disclosure is a method for joining a film onto a substrate, the method comprising the following steps (A) to (E):

a step (A) of floating the film on an interface between an aqueous liquid and a water-insoluble liquid, wherein:
   one surface of the film is hydrophilic,
   the other surface of the film opposite to the one surface comprises a water-repellent film, and
   the film is made afloat so that the one surface is in contact with the aqueous liquid and the other surface is in contact with the water-insoluble liquid;

a step (B) of immersing the substrate into the aqueous liquid;

a step (C) of stacking the substrate onto the one surface of the film in the aqueous liquid;

a step (D) of immersing the stacked substrate and film into the water-insoluble liquid with maintaining the substrate being stacked on the film to adhere the film to the substrate; and a step (E) of drawing up the stacked substrate and film from the water-insoluble liquid with maintaining the substrate being stacked on the film to join the film onto the substrate.

Since the method of the present disclosure does not require an adhesive, the method of the present disclosure does not cause any damages to the film.

Since the film floats on the interface of two liquid, the film having a large area can be joined on the for-joining-substrate without any damage.

BRIEF DESCRIPTION OF THE DRAWINGS

FIGS. 1(a) to 1(e) are schematic views showing the method for joining the film onto the substrate according to the embodiment 1.

FIGS. 2(a) and 2(b) are schematic views showing the vessel used for the method for joining the film onto the substrate according to the embodiment 1.

FIGS. 7(a) to 7(c) are schematic views showing the suction jig according to the embodiment 1.

FIGS. 10(a) to 10(f) are schematic views showing the method for forming the upper electrode onto the film and the evaluation method of the solar cell film.

FIGS. 11(a) and 11(b) are schematic views showing the epitaxial lift off method according to the prior art.

DETAILED DESCRIPTION OF THE INVENTION

Embodiment 1

Figure 3A:
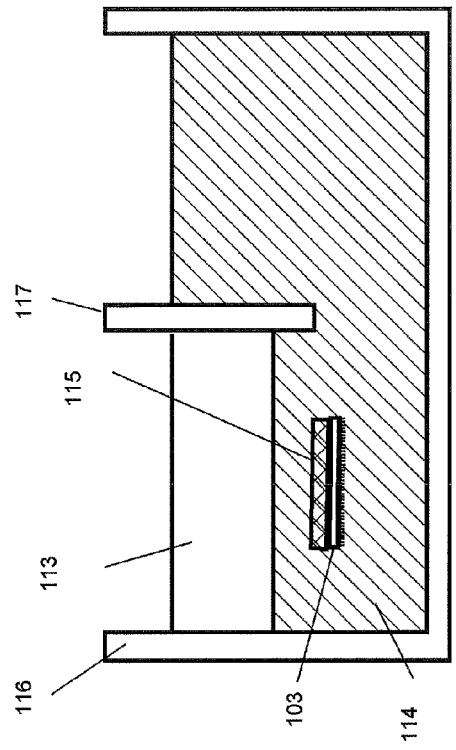
FIGS. 3(a) to 3(d) are schematic views showing the method for joining the film onto the substrate according to the embodiment 1.

FIG. 1 to FIG. 4 show a method for joining a film onto a substrate according to the embodiment 1. An example of the film is a solar cell film, which is represented by the reference sign of 103. FIG. 5 shows the substrate including the film. FIG. 6 and FIG. 7 show a vacuum suction jig. The present embodiment is described with reference to these drawings.

(Preliminary Step)

As shown in FIG. 5, a sacrifice substrate 101 is prepared. A sacrifice layer 102 and a solar cell film 103 are stacked on the surface of the sacrifice substrate 101.

An example of the material of the sacrifice substrate 101 is GaAs. An example of the material of the sacrifice layer 102 is $Al_xGa_{1-x}As$ (x represents not less than 0.6 and not more than 1). A small amount of Si, P, and Zn may be contained in the sacrifice layer 102.

The solar cell film 103 may be made of a compound semiconductor of a group-III element and a group-V element. For example, GaAs, GaInP, or InGaAs may be utilized.

In order to form the sacrifice layer 102 and the solar cell film 103 on the sacrifice substrate 101, a metal-organic chemical vapor deposition method (hereinafter, referred to as "an MOCVD method") or a molecular beam epitaxy method (hereinafter, referred to as "an MBE method") may be utilized.

The solar cell film includes a p-type semiconductor film and an n-type semiconductor film. The p-type semiconductor film is joined to the n-type semiconductor film, thereby forming a p-n junction between these films.

In order to absorb solar spectrum over a broad range, it is preferable that a plurality of p-n junctions are formed.

In the embodiment 1, the outermost surface of the solar cell film 103 is required to be hydrophilic. The phrase "the solid surface is hydrophilic." means that the static contact angle of pure water on the solid surface is less than 90 degree. Irradiation of oxygen plasma or ozone gas makes the outermost surface of the solar cell film 103 hydrophilic.

(Step 1)

As shown in FIG. 1(a), the solar cell film 103 is suctioned to a suction jig 106.

Figure 6B:
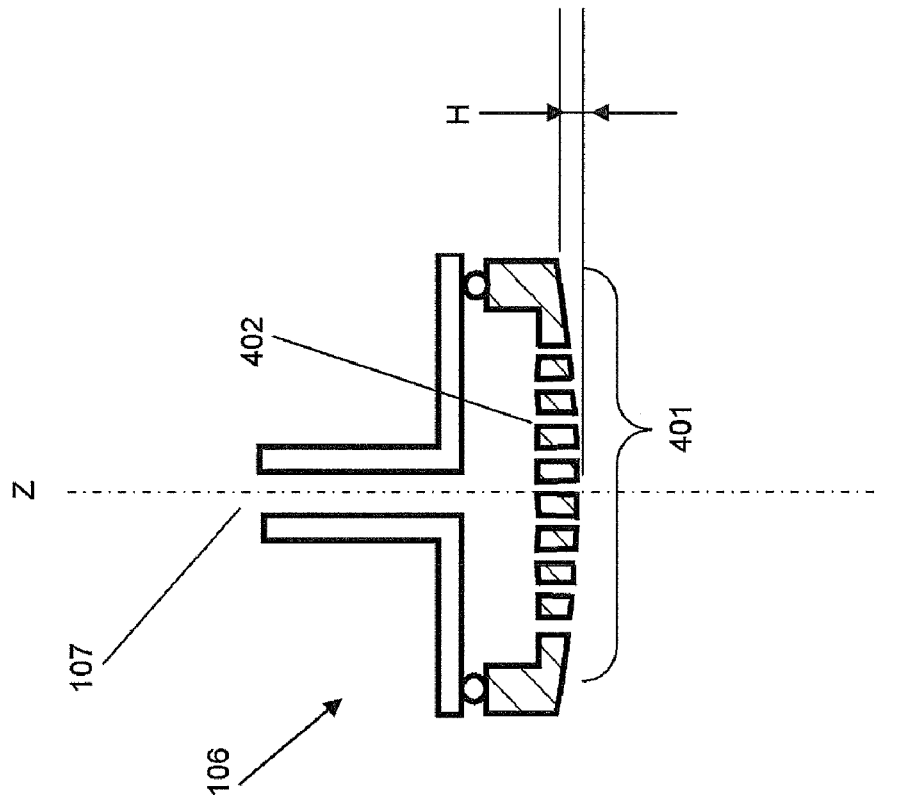
FIGS. 6(a) and 6(b) are schematic views showing the suction jig according to the embodiment 1.
Figure 6A:
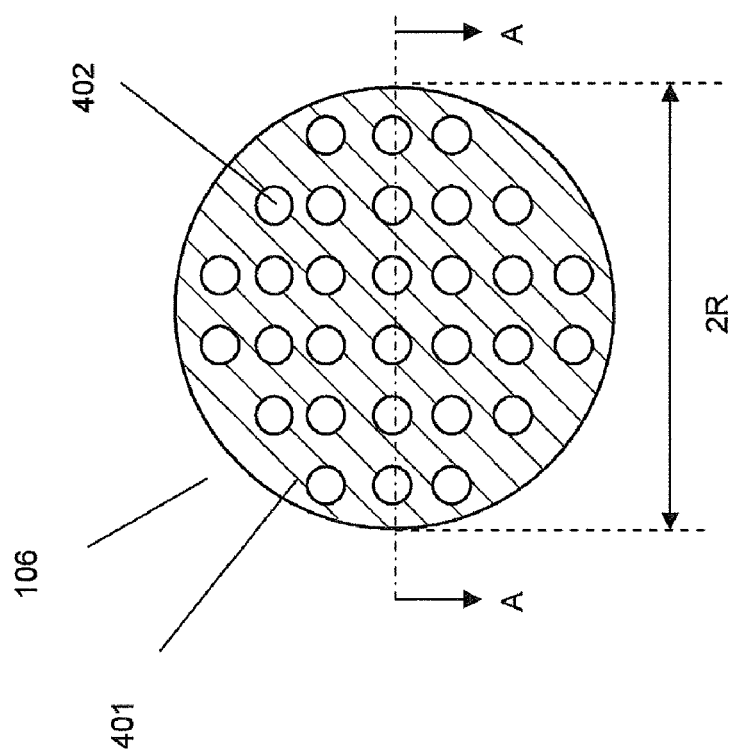

FIG. 6 shows an example of the suction jig 106. FIG. 6(a) is a schematic top view of the suction jig 106. FIG. 6(b) is a cross-sectional view of the A-A line in FIG. 6(a). The suction jig 106 includes a circular convex surface 401. The convex surface 401 has a through-hole 402.

The convex surface 401 is symmetrical with respect to the Z-Z line which passes the center of the convex surface 401 and is perpendicular to the convex surface 401. 2R represents a diameter of the circular convex surface 401. H represents the difference in height between the center of convex surface and the edge of the convex surface. It is preferable that the value of 2R/H is not less than 1,000 and less than 10,000.

The solar cell film 103 is disposed on the convex surface 401. Subsequently, air is suctioned through a suction opening 107 to attach the solar cell film 103 on the convex surface 401. Thus, the solar cell 103, the sacrifice layer 102, and the sacrifice substrate 101 deform convexly.

FIG. 7 shows another example of the suction jig 106. FIG. 7(a) is a schematic top view of the suction jig 106. FIG. 7(b) is a cross-sectional view of the A-A line in FIG. 7(a). FIG. 7(c) is a cross-sectional view of the B-B line in FIG. 7(a). As shown in FIG. 7(a), the X-direction denotes the direction parallel to the A-A line. The Y-direction denotes the direction parallel to the B-B line.

As shown 7(b), in the A-A cross-sectional view, the suction jig 106 has a convex surface 403. On the contrary, as shown in FIG. 7(c), in the B-B cross-sectional view, the suction jig 106 has a plane 404. Similar to the case in FIG. 6, it is preferable that the value of 2R/H is not less than 1,000 and less than 10,000.

(Step 2)

As shown in FIG. 1(b), the substrate 101 suctioned by the suction jig 106 is immersed in an etchant 108. In a case where the sacrifice layer 102 is an $Al_xGa_{1-x}As$ layer (x represents not less than 0.6 and not more than 1), hydrochloric acid and hydrofluoric acid aqueous solution may be used as the etchant 108.

Since the substrate 101 is deformed in a convex shape, the sacrifice layer 102 is easy to be subjected to the etchant 108, and the solar cell film 103 is easy to be peeled from the sacrifice substrate 101. The sacrifice substrate 101 is peeled from the solar cell film 103 by its own weight. Unlike the prior arts, it is not necessary to precisely control external force such as a weight.

As a result, as shown in FIG. 1(c), the substrate 101 is peeled from the solar cell film 103 and falls by gravity.

(Step 3)

In the step 3, a water-repellant treatment is performed on the reverse surface 119 of the solar cell film 103. The phrase "the solid surface is water-repellant." means that static contact angle of water dropped onto the solid surface is not less than 90 degree.

FIG. 1(*d*) shows an example of the water-repellant treatment. The solar cell film 103 attached to the suction jig 106 is immersed in a liquid 110 containing a water-repellant reagent. Thus, the water-repellant reagent is absorbed on the reverse surface 119, thereby forming a water-repellant film 111. Subsequently, the substrate 103 is immersed in another liquid and washed (not shown). As a result, only the reverse surface 119 of the solar cell film 103 becomes water-repellant.

Examples of the water-repellant reagent are a silane coupling reagent having a hydrocarbon group $(CH_3(CH_2)_n$; n represents an integer number of not less than 2 and not more than 17) or a fluorocarbon group $(CF_3(CF_2)_n$; n represents an integer number of not less than 0 and not more than 7). In particular, $CH_3(CH_2)_nSiCl_3$, $CH_3(CH_2)_nSi(OC_2H_5)_3$, and $CH_3(CH_2)_nSi(OCH_3)_3$ (n represents an integer number of not less than 2 and not more than 17) may be utilized. $CF_3(CF_2)_nC_2H_4SiCl_3$, $CF_3(CF_2)_nC_2H_4Si(OC_2H_5)_3$, and $CF_3(CF_2)_nC_2H_4Si(OCH_3)_3$ may also be used (n represents an integer number of not less than 0 and not more than 7).

In a case where the material of the solar cell film 103 is GaAs, mercaptan having a hydrocarbon group or a fluorocarbon group may be used. In particular, $CH_3(CH_2)_nSH$ (n represents an integer number of not less than 2 and not more than 17) and $CF_3(CF_2)_nC_2H_4SH$ (n represents an integer number of not less than 0 and not more than 7) may be used.

Instead of the immersion into the liquid 110, the surface 119 of the solar cell film 103 may be subjected to the vapor of the above-mentioned silane coupling reagent or the mercaptan.

(Step 4)

As shown in FIG. 1(*e*), the solar cell film 103 vacuum-suctioned by the suction jig 106 is immersed in the vessel 116 containing an aqueous liquid 113 and a liquid 114. The liquid 114 is insoluble in water (hereinafter, referred to as "water-insoluble liquid 114"). Subsequently, the suction of the solar cell film 103 is stopped. The vessel 116 is described in the step 5 in more detail.

Upon stopping of the suction, the solar cell film 103 is detached from the convex surface 401 and floats at the liquid/liquid interface between the aqueous liquid 113 and the water-insoluble liquid 114. The obverse surface of the solar cell film 103 is in contact with the aqueous liquid 113. The reverse surface 119 of the solar cell film 103 is in contact with the water-insoluble liquid 114 via the water-repellant film 111.

In the condition shown in FIG. 1(*e*), the following equation is satisfied.

(The self-gravity of the solar cell film 103)=(The buoyancy which the aqueous liquid 113 gives to the solar cell film 103)+(The buoyancy which the water-insoluble liquid 114 gives to the solar cell film 103)+(The force which the water-repellant film 111 gives to the solar cell film 103).

In the embodiment 1, the reverse surface 119 faces the water-insoluble liquid 114. The solar cell film 103 remains in the liquid/liquid interface stably.

Presumably, the reason why the solar cell film 103 floats at the liquid/liquid interface stably is described below.

The hydrophilic solid surface is energetically more stable in a case where it is in contact with the aqueous liquid, compared with the case where it is in contact with the water-insoluble liquid. On the contrary, the water-repellant surface is energetically more stable in the case where it is in contact with the water-insoluble liquid, compared with the case where it is in contact with the aqueous liquid. In a case where the entire of the solar cell film 103 floating at the liquid/liquid interface moves to the water-insoluble liquid 114, the hydrophilic surface of the solar cell film 103 becomes in contact with the water-insoluble liquid 114. This is energetically instable. On the contrary, in a case where the entire of the solar cell film 103 floating at the liquid/liquid interface moves to the aqueous liquid 113, the surface where the water-repellant film 113 is formed is in contact with the aqueous liquid. This is energetically instable.

In a case where the solar cell film 103 floating at the liquid/liquid interface is turned over, the solar cell film 103 becomes energetically instable, since the hydrophilic surface of the solar cell film 103 becomes in contact with the water-insoluble liquid 114, and the surface where the water-repellant film 111 is formed becomes in contact with the aqueous liquid 113.

In view of the above-mentioned energetical stability, the solar cell film 103 floats at the liquid/liquid interface in such a manner that the reverse surface 119 is in contact with the water-insoluble liquid 114 via the water-repellant film 111 and the obverse surface is in contact with the aqueous liquid 113.

An example of the aqueous liquid 113 is an aqueous solution where an inorganic salt is dissolved, an aqueous solution where an organic salt is dissolved, or pure water. An example of the water-insoluble liquid 114 is an alkane such as hexane, octane, nonane, decane, or undecane; a chlorinated solvent such as chloroform, 1-chlorobutane or 2-chlorobutane; or a mixture thereof.

In a case where the water-insoluble liquid 114 has greater density than the aqueous liquid 113, the water-insoluble liquid 114 positions beneath the aqueous liquid 113, as shown in FIG. 1(*e*).

On the contrary, in a case where the water-insoluble liquid 114 has smaller density than the aqueous liquid 113, the water-insoluble liquid 114 positions over the aqueous liquid 113. In this case, the reverse surface 119 of the solar cell film 103 is in contact with the aqueous liquid, and the obverse surface is in contact with the water-insoluble liquid 114.

(Step 5)

In the step 5, the solar cell film 103 floating at the liquid/liquid interface is joined to a substrate for joining 115 (hereinafter, referred to as "for-joining-substrate 115).

FIG. 2(*a*) shows a three-dimensional schematic view of the vessel 116 used in the step 5. FIG. 2(*b*) shows a cross-sectional view of the A-A line in FIG. 2(*a*).

As shown in FIGS. 2(*a*) and 2(*b*), the vessel 116 contains the aqueous liquid 113 and the water-insoluble liquid 114. The vessel 116 comprises a first portion 116L, a second portion 116R, and a partition plate 117. The partition plate 117 is provided between the first portion 116L and the second portion 116R. The partition plate 117 is not in contact with the bottom surface of the vessel 116. The water-insoluble liquid 114 may freely communicate between the first portion 116L and the second portion 116R.

The upper part of the first portion 116L is filled with the aqueous liquid 113. The lower part of the first portion 116L is filled with the water-insoluble liquid 114. The second part 116R is also filled with the water-insoluble liquid 114. The solar cell film 103 described in FIG. 1(*e*) floats at the liquid/liquid interface, which is formed in the first portion 116L.

As shown in FIG. 3(a), the for-joining-substrate 115 is immersed from over the first portion 116L to the aqueous liquid 113. It is required that the for-joining-substrate 115 is hydrophilic.

Example of the for-joining-substrate 115 are:
(i) an inorganic material substrate such as a glass substrate, a silicon nitride substrate, or a ceramic substrate,
(ii) a substrate where an oxide film or a nitride film such as a silicon oxide film, a silicon nitride film, or an aluminum oxide film is formed,
(iii) a hydrophilic resin substrate such as a nylon resin substrate, a polyacrylate resin substrate or a polymethylmetacrylate resin substrate,
(iv) a resin substrate having a surface provided with hydrophilic property by oxygen plasma or ozone gas, or
(v) substrate with a surface comprising a metal film.

Example of the resin of the (iv) are polyamide resin, polypropylene resin, polyethylene resin, or polyvinyl chloride resin.

Example of the metal in the (v) are Au, Ni, Al, Ti, or Cu.

Figure 3B:
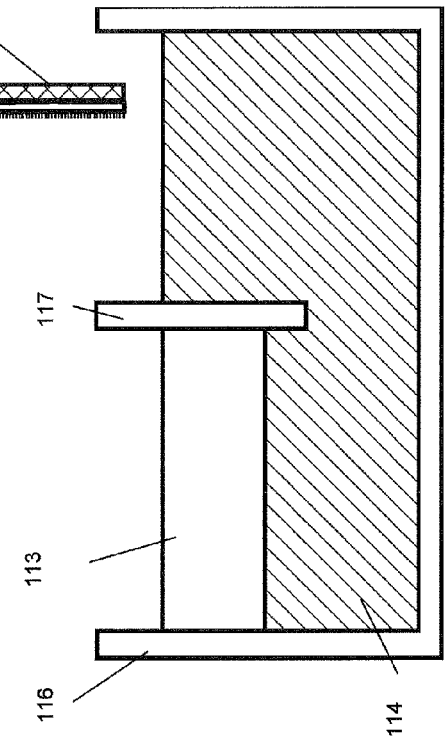

Next, as show in FIG. 3(b), the for-joining-substrate 115 is stacked onto the obverse surface of the solar cell film 103. Subsequently, the for-joining-substrate 115 and the solar cell film 103 are immersed in the water-insoluble liquid 114. In this manner, the for-joining-substrate 115 is adhered to the obverse surface of the solar cell film 103.

Figure 3C:
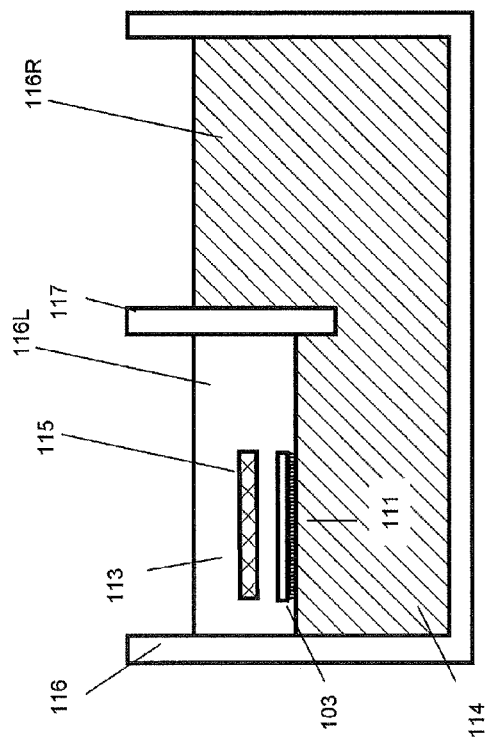

Furthermore, as shown in FIG. 3(c), the for-joining-substrate 115 and the solar cell film 103 are transferred from the first portion 116L to the second portion 116R through the lower part of the partition plate 117.

Figure 3D:
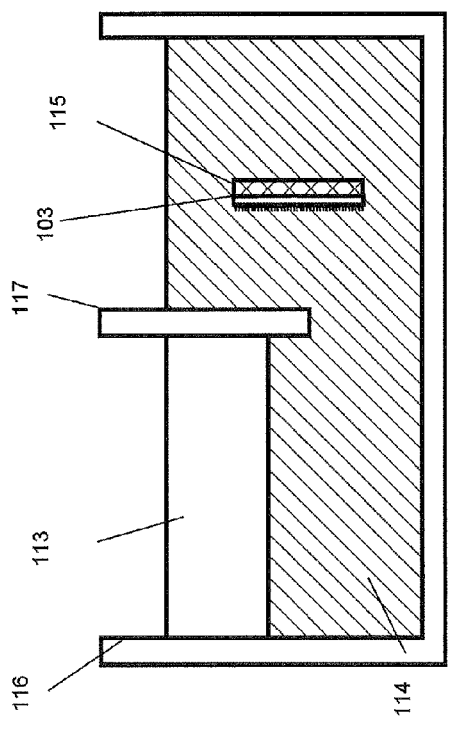

Finally, as shown in FIG. 3(d), the for-joining-substrate 115 and the solar cell film 103 are drawn up from the upper part of the second portion 116R. Thus, the solar cell film 103 is joined onto the for-joining-substrate 115.

FIG. 4(a) to FIG. 4(d) show an example where the first portion 116L is filled with the water-insoluble liquid 114 and the second portion 116R is filled with the aqueous liquid 113.

Figure 4A:
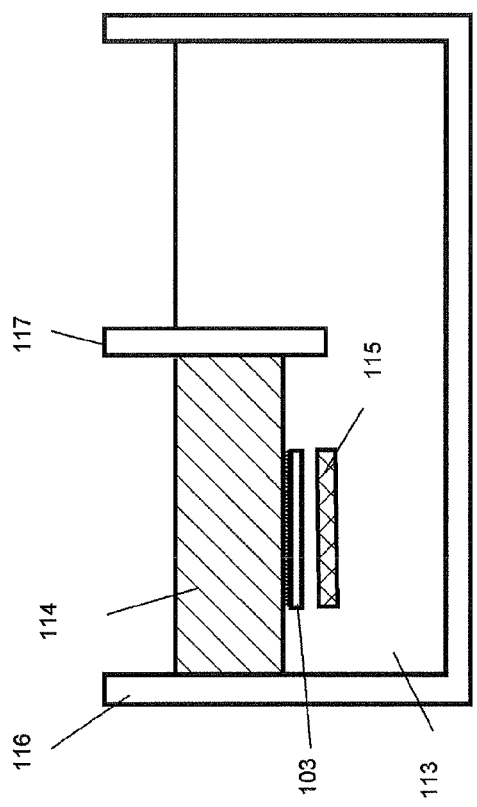
FIGS. 4(a) to 4(d) are schematic views showing the method for joining the film onto the substrate according to the embodiment 1.
Figure 5:
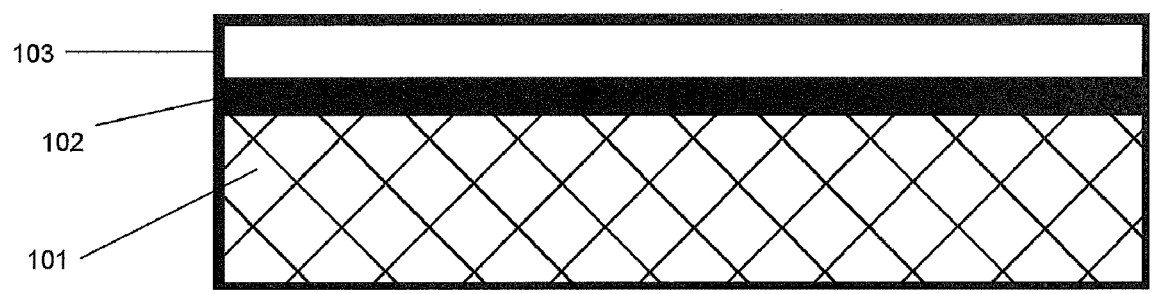
FIG. 5 is a schematic view showing the substrate where the film is formed according to the embodiment 1.

As shown in FIG. 4(a), the hydrophilic for-joining-substrate 115 is immersed from over the second portion 116R to the aqueous liquid 113. The for-joining-substrate 115 is transferred from the second portion 116R to the first portion 116L through the lower part of the partition plate 117.

Figure 4B:
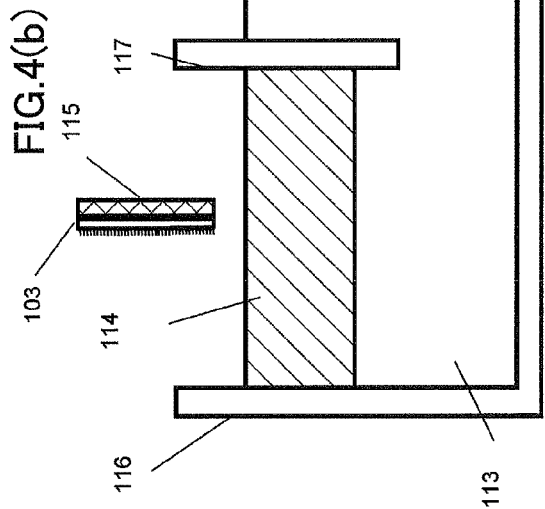
Figure 4C:
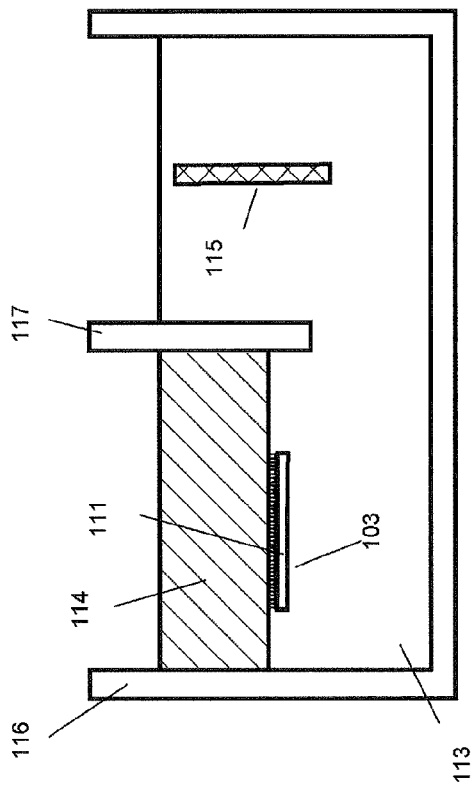

Next, as shown in FIG. 4(b), the for-joining-substrate 115 is stacked onto the solar cell film 103. Subsequently, as shown in FIG. 4(c), the for-joining-substrate 115 and the solar cell film 103 are immersed in the water-insoluble liquid 114.

Figure 4D:
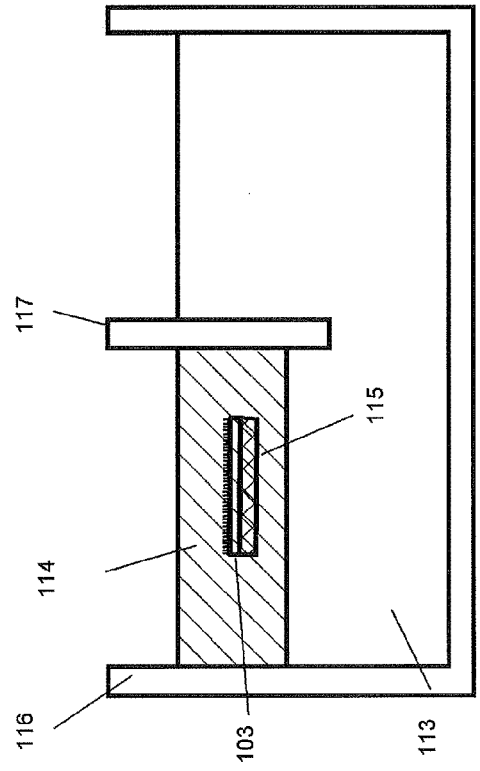

Finally, as shown in FIG. 4(d), the for-joining-substrate 115 and the solar cell film 103 are drawn up from the upper part of the first portion 116L. Thus, the solar cell film 103 is joined onto the for-joining-substrate 115.

Embodiment 2

Figure 8:
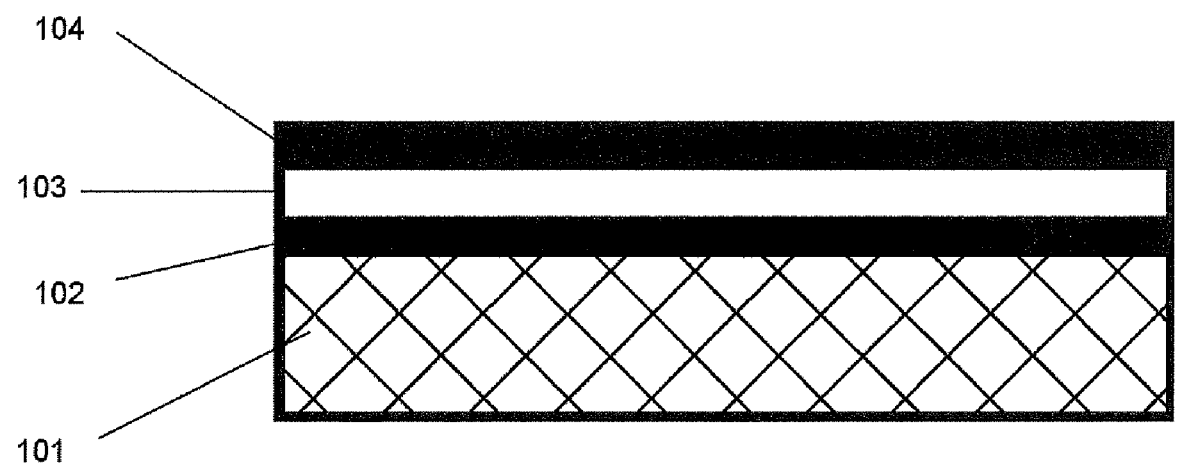
FIG. 8 is a schematic view showing the substrate where the solar cell film is formed according to the embodiment 2.

FIG. 8 shows a substrate used in the embodiment 2. The substrate is similar to that of the embodiment 1 except that an electrode 104 is formed on the solar cell film 103.

The electrode 104 is in ohmic contact with the solar cell film 103. The surface of the electrode is hydrophilic. In a case where the surface of the solar cell film 103 is made of an n-type GaAs, a laminated metal film of an AuGe alloy film, a Ni film and an Au film laminated in this order from the n-type GaAs by a vacuum deposition method may be utilized as the electrode 104. A heat treatment at a temperature range of not less than 400 degree Celsius and not more than 450 degree Celsius is performed optionally. After the vacuum-deposition, the Au film is hydrophilic. A titanium film may be formed on the surface of the Au film.

In a case where the solar cell film 103 is consisted of the p-type GaAs, a laminated metal film of a Ti film, a Pt film and an Au film laminated in this order on the surface of the p-type GaAs by a vacuum deposition method may be used as the electrode 104. A titanium film may be formed on the surface of the Au film.

The solar cell film 103 is joined onto the for-joining-substrate 115 similar to the case of the embodiment 1. However, in the embodiment 2, the surface of the for-joining-substrate 115 has an electrode including a Au film. In addition, the solar cell film 103 is adhered to the Au film of the electrode of the for-joining-substrate 115. Thus, the electrode 104 is electrically connected to the electrode of the for-joining-substrate 115.

Figure 9C:
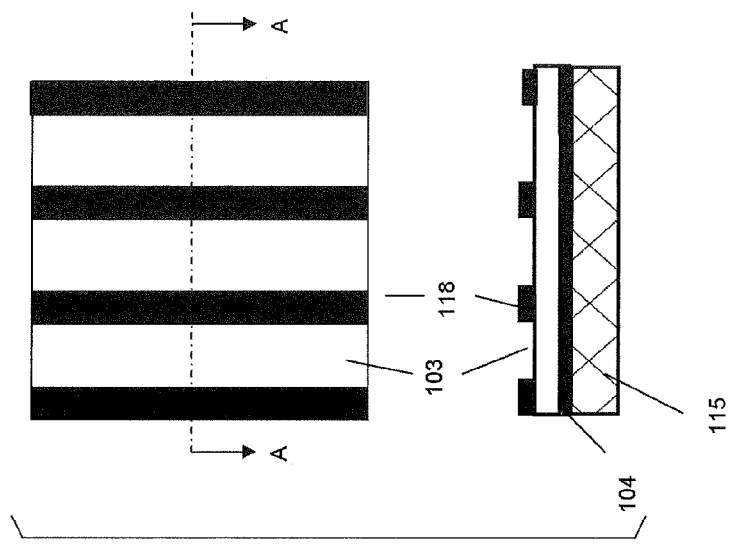
FIGS. 9(a) to 9(c) are schematic views showing the method for fabricating the upper electrode onto the joined film according to the embodiment 2.
Figure 9B:
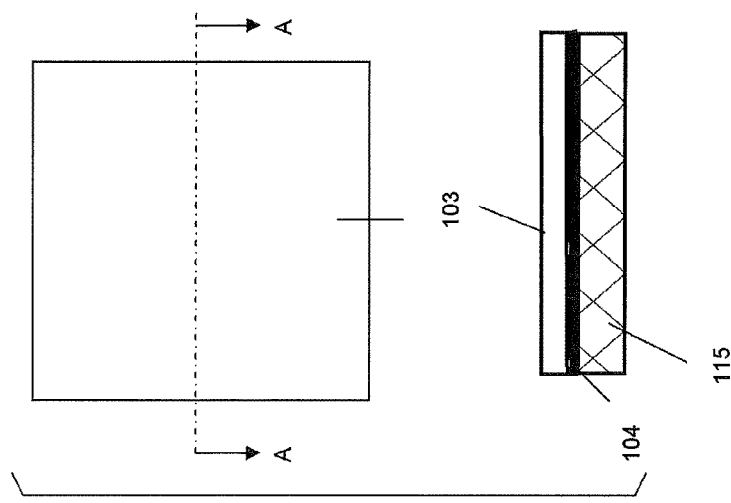
Figure 9A:
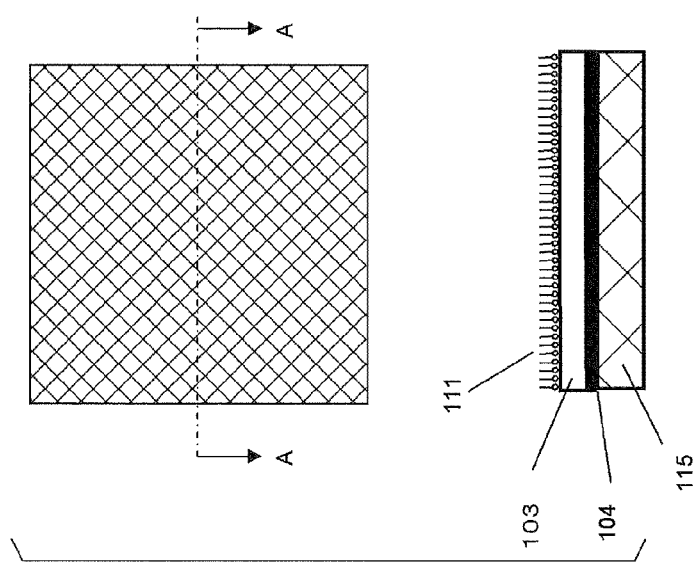

FIG. 9(a) to FIG. 9(c) show a method for forming an upper electrode 118 on the surface of the solar cell film 113 attached to the for-joining-substrate 115. Each of FIG. 9(a) to FIG. 9(c) includes an upper drawing and a lower drawing. All of the upper drawings are top views. Each of the lower drawings is a cross-sectional views of the A-A-line in the corresponding upper drawing.

FIG. 9(a) shows the solar cell film 103 attached to the for-joining-substrate 115. The surface of the solar cell film 103 has the water-repellant film 111.

As shown in FIG. 9(b), oxygen plasma or ozone gas is irradiated on the surface of the water-repellant film 111 to remove the water-repellant film 111. Instead of the irradiation, the for-joining-substrate 115 may be heated at the temperature of not less than 350 degree Celsius and not more than 400 degree Celsius to remove the water-repellant film 111.

Next, as shown in FIG. 9(c), the upper electrode 118 is formed on the surface of the solar cell film 103. An electrode pattern of the upper electrodes 118 may be formed with use of photolithography. In a case where the line widths of the upper electrodes 118 and the line intervals of the upper electrodes 118 are not less than 1 millimeter, a metal electrode pattern is formed by depositing a metal film through a metal mask. A material capable of being in ohmic contact with the solar cell film 103 is employed for the upper electrodes 118.

The electrode 104 and the upper electrode 118 are electrically connected to a peripheral device. When the surface of the solar cell film 103 is irradiated with sunshine, electric power is supplied to the peripheral device.

Example

In the example, the solar cell film formed on the GaAs sacrifice substrate was joined onto the silicon substrate as the for-joining-substrate.

The experiment procedure and its result are described below.

(1a. Preparation of the GaAs Substrate where the Solar Cell Film 103 was Formed)

A p-type GaAs substrate with a diameter of 4 inches and with a thickness of 600 micrometers was prepared. Zinc at a concentration of $3 \times 10^{18}$ cm$^{-3}$ had been doped in the p-type GaAs substrate. The materials shown in Table 1 were stacked on the p-type GaAs substrate in this order from bottom to top by an MOCVD method to form the solar cell film 103. Table 1 shows the materials, the thicknesses, and the dopants used for the solar cell film 103. The AlAs layer in Table 1 is the sacrifice layer 102.

TABLE 1

| Material | Thickness (micrometer) | Dopant | p-type/n-type | Concentration of the dopant (cm$^{-3}$) |
|---|---|---|---|---|
| GaAs | 0.02 | Te | n-type | $1 \times 10^{19}$ |
| GaIn$_{0.49}$As | 0.05 | Si | n-type | $2 \times 10^{18}$ |
| GaAs | 0.5 | Si | n-type | $1 \times 10^{18}$ |
| GaAs | 1.7 | Zn | p-type | $2 \times 10^{17}$ |
| GaAs | 2.8 | Zn | p-type | $4 \times 10^{18}$ |
| AlAs | 0.05 | (None) | — | — |
| GaAs | 0.2 | (None) | — | — |
| GaAs (the substrate) | 600 | Zn | p-type | $3 \times 10^{18}$ |

Next, a film consisting of GeAu alloy (Ge:Au=12 wt %:88 wt %) with a thickness of 100 nanometers was formed on the top GaAs layer of the solar cell film 103 by a resistant heat deposition method.

Furthermore, a Ni film with a thickness of 30 nanometers and an Au film with a thickness of approximately 250 nanometers were formed in this order by an electron beam evaporation method. Subsequently, the heat treatment of the solar cell film was performed in nitride atmosphere at the temperature of 400 degree Celsius for 10 minutes to form an ohmic contact between the solar cell film and the electrode.

(1b. Preparation of the for-Joining-Substrate)

A silicon substrate with a diameter of five inches was prepared. A titanium film with a thickness of 10 nanometers and an Au film with a thickness of 150 nanometers were formed in this order by a vacuum deposition method on the entire surface of the silicon substrate.

(2. Joining of the Solar Cell Film onto the Silicon Substrate)

Similar to the embodiment 1, the solar cell film was joined onto the silicon substrate. They were joined in such a manner that the Au electrode of the silicon substrate faced the Au electrode of the solar cell film.

The summary of the joining is described below.

The vacuum suction jig shown in FIG. 7(a) to FIG. 7(c) was used. The value of 2R was 110 millimeters, and the value of H was 100 micrometers. The diameter of each of the through-holes 402 was 300 micrometers. The number of the through-holes 402 was 175. The material of the convex surface 401 where the through-holes were formed was SiC.

While the GaAs sacrifice substrate was suctioned as shown in FIG. 1(a), the GaAs substrate with the solar cell film was immersed in a glass vessel containing 10N of the hydrochloric acid aqueous solution as shown in FIG. 1(b). Subsequently, the glass vessel was heated at a temperature of 70 degree Celsius for ten minutes. As a result, as shown in FIG. 1(c), the sacrifice layer 102 consisting of AlAs was etched and the solar cell film 103 was peeled from the GaAs sacrifice substrate 101.

Next, the solar cell film 103 was immersed in the vessel containing pure water to remove the hydrochloric acid remaining on the surface of the solar cell film 103. Subsequently, the solar cell film 103 was drawn up from the pure water. Nitrogen gas was blown to the solar cell film 103 to remove the pure water remaining on the surface of the solar cell film 103.

The solar cell film 103 suctioned to the suction jig was immersed for six hours in the ethanol where 1 vol % of hexadecanethiol was dissolved to form the water-repellant film 111 on the reverse surface 119 of the solar cell film 103 as shown in FIG. 1(d). Subsequently, the solar cell film 103 was drawn up from the ethanol. Nitrogen gas was brown to the solar cell film 103 to remove the ethanol remaining on the surface of the solar cell film 103.

Next, the vessel shown in FIG. 3(a) to FIG. 3(d) was prepared. Pure water was used as the aqueous liquid 103. As the water-insoluble liquid 114, 1,4-dichlorobutane was used.

While the solar cell film 103 was suctioned with the vacuum suction jig shown in FIG. 7(a) to FIG. 7(c), the solar cell film 103 was immersed from over the first portion 116L to place the solar cell film 103 in such a manner that the solar cell film 103 was substantially parallel to the interface of the water/the 1,4-dichlorobutane.

Next, the vacuum suction was stopped to detach the solar cell film 103 from the vacuum suction jig. Thus, the solar cell film 103 is made afloat on the interface of the water/the 1,4-dichlorobutane. The Au film of the solar cell film 103 was in contact with the water, and the bottom GaAs film of the solar cell film 103 was in contact with 1,4-dichlorobutane via the water-repellant film 111.

Subsequently, as shown in FIG. 3(b) to FIG. 3(d), the solar cell film was joined onto the silicon substrate 115. They were joined in such a manner that the Au electrode on the silicon substrate 115 faced the Au electrode of the solar cell film 103. The silicon substrate 115 and the solar cell film 103 were drawn up from the upper part of the second portion 116R with use of tweezers. Finally, the silicon substrate 115 and the solar cell film 103 were heated for one hour at a temperature of 350 degree Celsius.

The solar cell film 103 joined onto the silicon substrate 115 had a diameter of 100 millimeters. The solar cell film 103 was observed with an optical microscope. None of scarring, crack, or break was observed on the film.

(3. Formation of the Upper Electrode)

FIG. 10(a) to FIG. 10(e) show a method for fabricating the upper electrode 609 on the solar cell film 103 joined onto the silicon substrate 115.

FIG. 10(a) shows the solar cell film 601 joined onto the Au electrode 603 of a silicon substrate 602. The solar cell film 601 was disposed at the center of the silicon substrate 602.

The first metal mask shown in FIG. 10(b) was closely contact to the silicon substrate 602. The first metal mask 604 comprised four rectangular slits 605. Each of the penetrated slits 605 had a short side with a length of one millimeter. The four slits 605 were disposed with an equal interval, and the four slits 605 were in internal contact with a circle having a diameter of 80 millimeters.

As shown in FIG. 10(c), through the first metal mask 604, a titanium film with a thickness of 50 nanometers, a Pt film with a thickness of 150 nanometers, and an Au film with a thickness of 50 nanometers were formed in this order on the solar cell film 601 by an electric beam deposition method. Thus, the upper electrode 606 corresponding to the slits 605 was formed on the solar cell film 601.

Similarly, the second metal mask shown in FIG. 10(d) was closely contacted to the silicon substrate 602. As shown in FIG. 10(e), a titanium film with a thickness of 50 nanometers, a Pt film with a thickness of 150 nanometers, and an Au film with a thickness of 50 nanometers were formed in this order by an electric beam deposition method. Thus, the upper electrode 609 corresponding to slits 608 was formed.

The second metal mask 607 had two slits 608. Each of the slits 608 had a shape of a half-circle with a diameter of 80 millimeters and with a width of 2 millimeters.

(4. Evaluation of the Solar Cell Film)

FIG. 10(f) shows a method for evaluating the electric property of the solar cell 601 shown in FIG. 10(e).

A probe 610 and a probe 611 were brought into contact with the Au electrode 603 and the upper electrode 609, respectively. These probes 610 and 611 were electrically connected to a current-voltage evaluation device 612.

The light with an intensity of 100 mW/cm$^2$ was irradiated from a pseudo-sun light source to the solar cell film 601 to examine the current-voltage property. As a result, the solar cell film joined onto the silicon substrate exhibited the following properties.

Open voltage: 0.9 V
Short-circuit current: 14 mA/cm$^2$
Fill factor: 0.8
Conversion efficiency: 10%

INDUSTRIAL APPLICABILITY

The joining method of the present disclosure can provide a method for joining a III-V solar cell film onto a plastic substrate, which is lightweight and flexible. The solar cell can be installed on a movable body such as a car, a airplane, a ship, or an artificial satellite.

What is claimed is:

1. A method for joining a film onto a substrate, the method comprising the following steps (A) to (E):
   a step (A) of floating the film on an interface between an aqueous liquid and a water-insoluble liquid, wherein:
      one surface of the film is hydrophilic,
      the other surface of the film opposite to said one surface comprises a water-repellent film, and
      the film is made afloat so that said one surface is in contact with the aqueous liquid and the other surface is in contact with the water-insoluble liquid;
   a step (B) of immersing the substrate into the aqueous liquid;
   a step (C) of stacking the substrate onto said one surface of the film in the aqueous liquid;
   a step (D) of immersing the stacked substrate and film into the water-insoluble liquid with maintaining the substrate being stacked on the film to adhere the film to the substrate; and
   a step (E) of drawing up the stacked substrate and film from the water-insoluble liquid with maintaining the substrate being stacked on the film to join the film onto the substrate,
   said method further comprising:
   before the step (A), a step of preparing a container, wherein:
      the container comprises a first portion, a second portion and a partition plate,
      the partition plate is provided between the first portion and second portion,
      the partition plate fails to be in contact with the bottom surface of the container, thereby providing a communication path,
      an upper portion of the first portion is filled with the aqueous liquid, and
      the second portion and a lower portion of the first portion are filled with the water-insoluble liquid; and
   between the step (D) and the step (E), a step of transferring the substrate and the film from the first portion to the second portion through the communicating path with maintaining the substrate being stacked on the film.

2. The method according to claim 1, wherein the film comprises a III-V compound semiconductor.

3. The method according to claim 1, wherein the substrate is hydrophilic.

4. A method for joining a film onto a substrate, the method comprising the following steps (A) to (E):
   a step (A) of floating the film on an interface between an aqueous liquid and a water-insoluble liquid, wherein:
      one surface of the film is hydrophilic,
      the other surface of the film opposite to said one surface comprises a water-repellent film, and
      the film is made afloat so that said one surface is in contact with the aqueous liquid and the other surface is in contact with the water-insoluble liquid;
   a step (B) of immersing the substrate into the aqueous liquid;
   a step (C) of stacking the substrate onto said one surface of the film in the aqueous liquid;
   a step (D) of immersing the stacked substrate and film into the water-insoluble liquid with maintaining the substrate being stacked on the film to adhere the film to the substrate; and
   a step (E) of drawing up the stacked substrate and film from the water-insoluble liquid with maintaining the substrate being stacked on the film to join the film onto the substrate;
   said method further comprising:
   before the step of (A), a step of preparing a container, wherein:
      the container comprises a first portion, a second portion and a partition plate,
      the partition plate is provided between the first portion and second portion,
      the partition plate fails to be in contact with the bottom surface of the container, thereby providing a communication path,
      an upper portion of the first portion is filled with the water-insoluble liquid, and
      the second portion and a lower portion of the first portion are filled with the aqueous liquid; and
   between the step (B) and the step (C), a step of transferring the substrate from the second portion to the first portion through the communicating path.

5. The method according to claim 4, wherein the film comprises a III-V compound semiconductor.

6. The method according to claim 4, wherein the substrate is hydrophilic.

* * * * *